US009859517B2

(12) United States Patent
Lai

(10) Patent No.: US 9,859,517 B2
(45) Date of Patent: Jan. 2, 2018

(54) WHITE ORGANIC LIGHT-EMITTING DIODE

(71) Applicant: Nitto Denko Corporation, Osaka (JP)

(72) Inventor: Qianxi Lai, Carlsbad, CA (US)

(73) Assignee: Nitto Denko Corporation, Osaka (JP)

( * ) Notice: Subject to any disclaimer, the term of this patent is extended or adjusted under 35 U.S.C. 154(b) by 848 days.

(21) Appl. No.: 14/020,609

(22) Filed: Sep. 6, 2013

(65) Prior Publication Data
US 2014/0070194 A1    Mar. 13, 2014

Related U.S. Application Data

(60) Provisional application No. 61/698,049, filed on Sep. 7, 2012.

(51) Int. Cl.
*H01L 51/50* (2006.01)

(52) U.S. Cl.
CPC ........ *H01L 51/5016* (2013.01); *H01L 51/504* (2013.01); *H01L 2251/5376* (2013.01)

(58) Field of Classification Search
CPC ... H01L 51/50; H01L 51/0061; H01L 51/006; H01L 51/5012; H01L 51/5016; H01L 51/504; H01L 51/5056; H01L 51/5072; H01L 51/5088; H01L 51/5092; H01L 51/5296
USPC ........... 252/301.26, 301.16; 257/40; 544/341
See application file for complete search history.

(56) References Cited

U.S. PATENT DOCUMENTS

| | | | |
|---|---|---|---|
| 4,769,292 A | 9/1988 | Tang et al. | |
| 6,097,147 A | 8/2000 | Baldo et al. | |
| 6,310,360 B1 | 10/2001 | Forrest et al. | |
| 6,784,016 B2 | 8/2004 | Long et al. | |
| 7,474,049 B2 | 1/2009 | Liu et al. | |
| 7,579,773 B2 | 8/2009 | Forrest et al. | |
| 7,683,229 B2 | 3/2010 | Stoessel et al. | |
| 7,859,186 B2 | 12/2010 | Noh et al. | |
| 7,906,902 B2* | 3/2011 | Burn .................... | C07F 15/0033 252/301.16 |
| 7,982,213 B2* | 7/2011 | Okajima ............... | C07D 471/04 257/40 |
| 8,003,229 B2 | 8/2011 | Sisk et al. | |
| 8,114,529 B2* | 2/2012 | Kitazawa .............. | C09K 11/06 313/504 |
| 8,357,800 B2* | 1/2013 | Nazeeruddin ....... | C07F 15/0033 546/4 |
| 8,441,187 B2* | 5/2013 | Hunze ................. | H01L 51/5012 313/506 |
| 8,604,689 B2* | 12/2013 | Ma ...................... | H01L 51/5004 313/504 |
| 8,816,329 B2* | 8/2014 | Krause .................. | H01L 51/00 257/288 |
| 8,920,942 B2* | 12/2014 | Otsu ...................... | C09K 11/06 252/301.16 |
| 8,921,843 B2* | 12/2014 | Song .................... | H01L 51/0058 257/40 |
| 9,172,055 B2* | 10/2015 | Kim ..................... | H01L 51/5064 |
| 9,312,497 B2* | 4/2016 | Han ...................... | C07D 401/14 |
| 9,337,358 B2* | 5/2016 | Byrne .................. | C08G 61/123 |
| 9,365,679 B2* | 6/2016 | Zhou ...................... | C09K 11/06 |
| 9,376,529 B2* | 6/2016 | Brown ................. | C07D 285/14 |
| 9,397,300 B2* | 7/2016 | Park ...................... | H01L 51/006 |
| 9,520,566 B2* | 12/2016 | Kim ..................... | H01L 51/0054 |
| 2005/0282036 A1 | 12/2005 | D'Andrade et al. | |
| 2007/0122657 A1* | 5/2007 | Klubek ............... | H01L 51/0054 428/690 |
| 2007/0138947 A1 | 6/2007 | Popovic et al. | |
| 2007/0194701 A1 | 8/2007 | Ito et al. | |
| 2007/0248840 A1 | 10/2007 | Lin et al. | |
| 2007/0285010 A1* | 12/2007 | Lee ..................... | H01L 51/0037 313/504 |
| 2008/0258606 A1 | 10/2008 | Butler et al. | |
| 2008/0284317 A1 | 11/2008 | Liao et al. | |
| 2008/0286610 A1 | 11/2008 | Deaton et al. | |
| 2009/0039294 A1* | 2/2009 | Choong ............. | H01L 51/5016 250/493.1 |
| 2009/0134384 A1 | 5/2009 | Stoessel et al. | |
| 2009/0230844 A1 | 9/2009 | Pfeiffer et al. | |
| 2009/0230855 A1 | 9/2009 | Kim et al. | |
| 2010/0060152 A1 | 3/2010 | Kathirgamanathan et al. | |
| 2010/0072887 A1 | 3/2010 | Kwong et al. | |
| 2010/0148157 A1 | 6/2010 | Song et al. | |
| 2010/0155706 A1 | 6/2010 | Yu et al. | |
| 2010/0163857 A1 | 7/2010 | Kim et al. | |
| 2010/0187517 A1 | 7/2010 | Nishimura et al. | |

(Continued)

FOREIGN PATENT DOCUMENTS

| | | | | |
|---|---|---|---|---|
| DE | WO 2010048920 A1 * | 5/2010 | ............ | H01L 51/00 |
| WO | WO 2006/113106 | 10/2006 | | |
| WO | WO 2008/143791 | 11/2008 | | |
| WO | WO 2009/028832 | 3/2009 | | |
| WO | WO 2010/016990 | 2/2010 | | |

OTHER PUBLICATIONS

Schwartz et al., "Harvesting Triplet Excitons from Fluorescent Blue Emitters in White Organic Light-Emitting Diodes," Advanced Materials, 2007, vol. 19, pp. 3672-3676.

Schwartz et al., "Triplet Harvesting in Hybrid White Organic Light-Emitting Diodes," Advanced Functional Materials, 2009, vol. 19, pp. 1-15.

Seo et al., "Hybrid Spacer for High-Efficiency White Organic Light-Emitting Diodes," Applied Physics Letters, 2008, vol. 92, pp. 183303-1-183303-3.

(Continued)

*Primary Examiner* — Douglas McGinty
(74) *Attorney, Agent, or Firm* — Knobbe, Martens, Olson & Bear, LLP

(57) ABSTRACT

An emissive construct comprising a fluorescent layer comprising a fluorescent host and a fluorescent dopant, wherein the fluorescent layer has a higher electron mobility than hole mobility; a first phosphorescent layer, comprising a first phosphorescent host and a first phosphorescent dopant, wherein the phosphorescent layer has a higher electron mobility than hole mobility; and an exciton blocking layer disposed between the fluorescent layer and the phosphorescent layer.

18 Claims, 3 Drawing Sheets

(56) References Cited

U.S. PATENT DOCUMENTS

| | | | | |
|---|---|---|---|---|
| 2010/0200847 A1* | 8/2010 | Kawakami | C07D 209/86 | 257/40 |
| 2010/0219407 A1* | 9/2010 | Kamatani | C07C 17/14 | 257/40 |
| 2010/0253208 A1* | 10/2010 | Cheng | C07D 235/02 | 313/504 |
| 2010/0270539 A1 | 10/2010 | Nishimura et al. | | |
| 2010/0301316 A1* | 12/2010 | Nowatari | H01L 51/5088 | 257/40 |
| 2011/0140093 A1* | 6/2011 | Zheng | C07D 235/18 | 257/40 |
| 2011/0297922 A1* | 12/2011 | Krause | H01L 51/00 | 257/40 |
| 2012/0179089 A1* | 7/2012 | Sisk | C07D 401/04 | 604/20 |
| 2013/0001528 A1* | 1/2013 | Chang | H01L 51/0051 | 257/40 |
| 2013/0112920 A1* | 5/2013 | Stoessel | C07D 487/02 | 252/301.16 |
| 2013/0200338 A1* | 8/2013 | Kim | C07D 213/74 | 257/40 |
| 2013/0292653 A1* | 11/2013 | Park | C07D 221/08 | 257/40 |
| 2014/0183422 A1* | 7/2014 | Stoessel | C07F 15/0086 | 252/519.2 |
| 2016/0194439 A1* | 7/2016 | Qin | C08G 61/126 | 252/501.1 |
| 2016/0214942 A1* | 7/2016 | Parham | C07D 401/14 | |

OTHER PUBLICATIONS

Wen et al., "Red Organic Light Emitting Device with Improved Performance Using a Novel Fluorescent Dye Codoped with Phosphor-Sensitizer," Chinese Science Bulletin, Aug. 2010, vol. 55, No. 24, pp. 2738-2743.

Xu et al., "Synthesis and Properties of a Novel Triphenylamine Derivative," Chinese Chemical Letters, 2005, vol. 16, No. 2, pp. 159-162.

\* cited by examiner

WHITE ORGANIC LIGHT-EMITTING DIODE

CROSS-REFERENCE TO RELATED APPLICATIONS

This application claims the benefit of priority to U.S. Application No. 61/698,049, filed Sep. 7, 2012, which is hereby incorporated by reference in its entirety.

BACKGROUND

Field

Some embodiments include emissive constructs for use in light-emitting devices.

Description of the Related Art

Organic white light emitting diodes (OLED) using all-phosphorescent emitters have shown impressive power efficiency that is close to the requirement for lightning applications. However, the device operation lifetime may be hampering commercial application due to the intrinsically short life time of blue phosphorescent emitters. Thus, improvements to the lifetime of OLEDs may facilitate commercialization of these devices for lighting applications.

SUMMARY

Some embodiments include an emissive construct comprising: a fluorescent layer comprising a fluorescent host and a fluorescent dopant, wherein the fluorescent layer has a higher electron mobility than hole mobility; an exciton blocking layer disposed on the fluorescent layer; and a first phosphorescent layer, disposed on the exciton blocking layer, comprising a first phosphorescent host and a first phosphorescent dopant, wherein the phosphorescent layer has a higher electron mobility than hole mobility.

Some embodiments include a light-emitting device comprising an emissive construct described herein.

DETAILED DESCRIPTION

Figure 1:
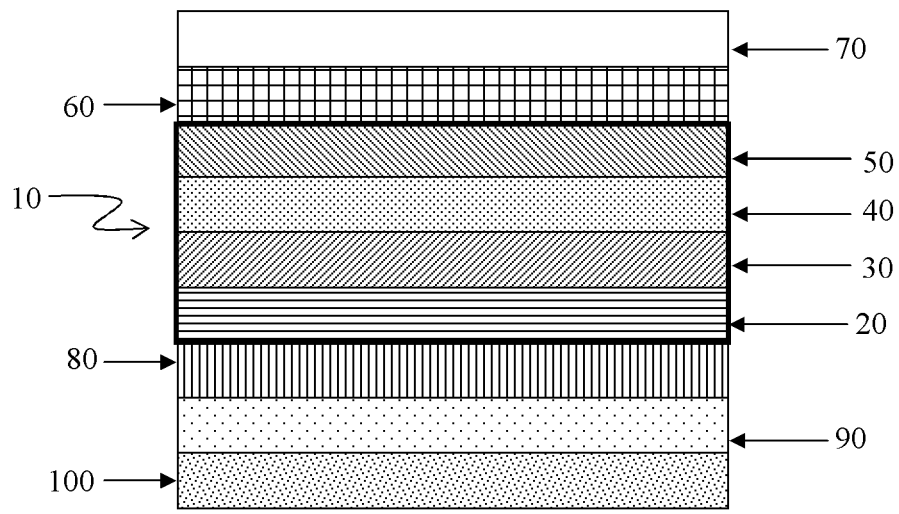
FIG. 1 is a schematic of an embodiment of a light-emitting device.

Generally, an emissive construct may comprise a fluorescent layer, an exciton blocking layer, and a phosphorescent layer.

A fluorescent layer comprises a fluorescent host and a fluorescent dopant. The fluorescent host may be any material that is a suitable host for a fluorescent dopant. A material may also be a suitable host for a fluorescent dopant if it has a higher energy lowest excited singlet state (S1) than the fluorescent dopant. This may help energy transfer from a higher energy S1 host exciton to a fluorescent dopant having a lower energy S1 excited state, thus promoting fluorescence from the fluorescent dopant. In some embodiments, the S1 energy of a fluorescent host is at least about 0.2 eV, at least about 0.4 eV, or at least about 0.6 eV. In some embodiments, the S1 energy of a fluorescent host is 0.2-0.8 eV higher than the S1 energy of a fluorescent dopant.

The S1 energy may be determined by a number of methods. For example, the S1 energy may be estimated by taking the maximum from the highest energy (e.g. shortest wavelength) peak in a fluorescence emission spectrum.

A material may be a suitable host for a fluorescent dopant if it has a higher energy lowest occupied molecular orbital (LUMO) than the fluorescent dopant. This may help to transfer electrons from the higher energy LUMO of the host to the lower energy LUMO of the fluorescent dopant, thus promoting formation of excitons in the dopant. In some embodiments, the absolute value of the difference (e.g. the value as a positive number regardless whether the difference is positive or negative) between the energy of the LUMO of the fluorescent host and the energy of the LUMO of the fluorescent dopant may be at least about 0.1 eV or at least about 0.5 eV. In some embodiments, the absolute value of the difference between the energy of the LUMO of the fluorescent host and the energy of the LUMO of the fluorescent dopant may be about 0.1-0.5 eV.

A material may also be a suitable host for a fluorescent dopant if it has a lower energy highest occupied molecular orbital (HOMO) than the fluorescent dopant. This may help to transfer holes from the lower energy HOMO of the host to the higher energy HOMO of the fluorescent dopant, thus promoting formation of excitons in the dopant. In some embodiments, the absolute value of the difference between the energy of the HOMO of the fluorescent host and the energy of the HOMO of the fluorescent dopant may be at least about 0.1 eV or at least about 0.5 eV. In some embodiments, the absolute value of the difference between the energy of the HOMO of the fluorescent host and the energy of the HOMO of the fluorescent dopant may be about 0.1-0.5 eV.

The HOMO and LUMO energy levels for organic materials to be used in OLEDs may be obtained by several conventional methods known in the art, e.g. solution electrochemistry, ultraviolet photoelectron spectroscopy (UPS), inverse photoemission spectroscopy, etc. In some embodiments, HOMO and LUMO energy levels for organic materials to be used in OLEDs may be obtained using a cyclic voltammetry (CV) instrument (model µAutolab type II) manufactured by Metrohm USA (Riverview, FLA, USA) in conjunction with GPES/FRA software (version 4.9).

The fluorescent host also has a higher electron mobility than hole mobility. In some embodiments, the fluorescent layer (and not just the fluorescent host) has a higher electron mobility than hole mobility. For OLED devices comprising a hole-transport layer and an electron-transport layer, the hole-transport layer may transport holes at a substantially faster rate than the electron-transport layer transports electrons. If the hole-transport rate in the fluorescent layer is sufficiently fast, the holes may be transported through the fluorescent layer before electrons can reach the fluorescent layer so that substantially all of the excitons are formed outside of the fluorescent layer. This may substantially reduce the blue emission of the device. One advantage of a higher electron mobility than hole mobility in the fluorescent layer is that it may allow the holes to combine with the electrons to form excitons in the fluorescent layer instead of forming somewhere closer to the electron-transport layer.

Another advantage of having a higher electron mobility than hole mobility is that it may provide better charge balance to the fast moving holes from the hole-transport layer. Host or dopant molecules that have holes are radical cations, which tend to be unstable and can degrade more rapidly than is desirable. Thus, having a higher electron mobility than hole mobility may improve the stability of a blue fluorescent layer. In some embodiments, the electron mobility may be at least about 2 times or at least about 40 times that of the hole mobility in the fluorescent host or the fluorescent layer. In some embodiments, the electron mobility may be about 2 times to 100 times that of the hole mobility in the fluorescent host or the fluorescent layer.

While there are many methods known in the art for measuring electron and hole mobility for materials of an LED, one method that may be used is provided in Example 1.

Some examples of useful hosts may include, but are not limited to, ADN, MADN, and those described immediately below.

| Host Compound | HOMO | LUMO | S1 | T1 | Hole-transport Rate | Eletron-transport Rate |
|---|---|---|---|---|---|---|
| ADN | −5.45 eV | −2.5 eV | 2.92 eV | 1.8 eV | 3.46e−6 cm$^2$/Vs | 9.73e−7 cm$^2$/Vs |
| DPAVBi | −5.16 eV | −2.39 eV | 2.62 eV | n/a | | |
| ADN:DPAVBi | | | | | 1.34e−8 cm$^2$/Vs | 7.19e−7 cm$^2$/Vs |

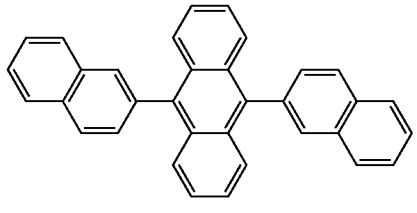

anthracene-9,10-dinaphthylene
ADN

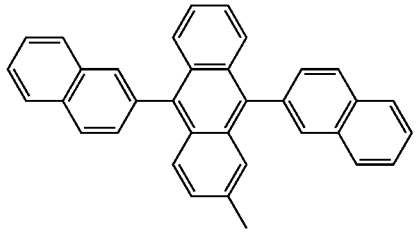

2-Methyl-9,10-bis(naphthalen-2-yl)anthracene
MADN

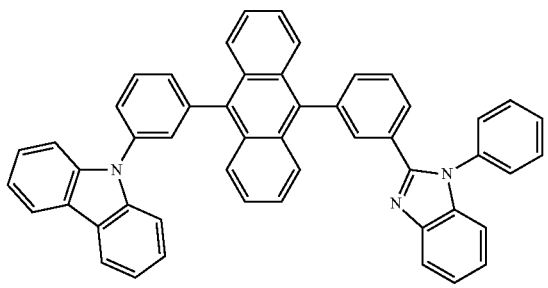

9-(3-(10-(3-(1-phenyl-1H-benzo[d]imidazol-2-yl)phenyl)anthracen-9-yl)phenyl)-9H-carbazole

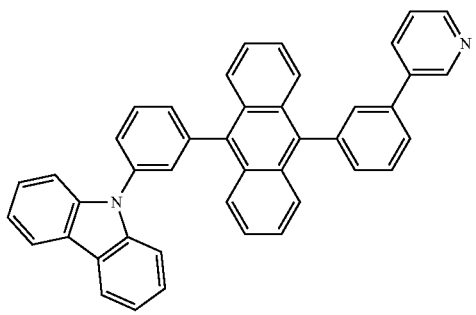

9-(3-(10-([3,3′-bipyridin]-5-yl)anthracen-9-yl)phenyl)-9H-carbazole

| Host Compound | HOMO | LUMO | S1 | T1 | Hole-transport Rate | Eletron-transport Rate |
|---|---|---|---|---|---|---|

10,10'-(2',4',6'-trimethyl-[1,1':3',1''-terphenyl]-4,4''-diyl)bis(9-(naphthalen-2-yl)anthracene)

1,3-bis(10-(naphthalen-2-yl)anthracen-9-yl)benzene 3,5-bis(10-(naphthalen-2-yl)anthracen-9-yl)pyridine In some embodiments, the host is non-polymeric. In some embodiments, the host has a weight average molecular weight of less than about 10,000 Da, less than about 5,000 Da, less than about 1,500 Da, less than about 1,000 Da, or less than about 800 Da.

A fluorescent dopant may be any compound that fluoresces in the visible range. A relatively high quantum yield visibly fluorescing compound may improve efficiency of the device. In some embodiments, the fluorescent dopant may have a fluorescent quantum yield of about 0.6-0.9. Some examples of suitable fluorescent dopants may include, but are not limited to, DPAVBi, TBPe, and DPVBi.

| Fluorescent Compound | HOMO | LUMO | S1 | T1 |
|---|---|---|---|---|
| DPAVBi | −5.16 eV | −2.39 eV | 2.62 eV | n/a |

4,4'-bis[4-(diphenylamino)-2-phenylvinyl]biphenyl DPAVBi

In some embodiments, the fluorescent host is non-polymeric. In some embodiments, the fluorescent host has a weight average molecular weight of less than about 10,000 Da, less than about 5,000 Da, less than about 1,500 Da, less than about 1,000 Da, or less than about 800 Da.

The amount of the fluorescent dopant in the fluorescent layer may vary. For example, the amount of fluorescent dopant may be: about 0.1% to about 10%, about 1% to about 5%, or about 3% by weight.

In some embodiments, the fluorescent host is ADN, and the fluorescent dopant is DPAVBi.

The thickness of a fluorescent layer may vary, and may be used to tune the amount of blue emission. For example, a thicker fluorescence layer may provide more blue emission, and a thinner layer may provide a less blue emission, depending upon the desired color of the emission of the device. In some embodiments, the thickness of the fluorescent layer may be in a range of about 0.1 nm to about 10 nm, about 3 nm to about 7 nm, or about 5 nm.

A blue emissive layer that is fluorescent may provide more stable blue emission as compared to a phosphorescent blue layer. For white OLEDs, this may provide more stable white emission in the device.

The emissive constructs generally comprise one or more phosphorescent layers. Generally, a phosphorescent layer may comprise a phosphorescent host and a phosphorescent dopant. Although distinct phosphorescent layers can be different in composition, any phosphorescent host may be used in any phosphorescent layer, and any phosphorescent dopant may be used in any phosphorescent layer. In some instances, a phosphorescent host may be designated as a "first phosphorescent host," a "a second phosphorescent host," etc., or a phosphorescent dopant may be designated as "a first phosphorescent dopant," a "second phosphorescent dopant," etc., for convenience purposes, so as not to cause confusion as to which layer contains the material. However, it should be understand that the materials for phosphorescent layers are generally interchangeable.

A phosphorescent host may be any material that is a suitable host for a phosphorescent dopant. In some embodiments, a material may be a suitable host for a phosphorescent dopant if it has a higher triplet energy (T1) than the phosphorescent dopant. This may help energy transfer from a higher energy T1 host exciton to a phosphorescent dopant with a lower energy T1, thus promoting phosphorescence from the phosphorescent dopant. In some embodiments, the T1 energy of a phosphorescent host is at least about 0.1 ev, at least about 0.2 eV, or at least about 0.5 eV higher than the T1 energy of a phosphorescent dopant. In some embodiments, the T1 energy of a phosphorescent host is about 0.1-about 0.8 eV or about 0.2-about 0.8 eV higher than the T1 energy of a phosphorescent dopant.

The T1 energy may be determined by a number of methods. For example, the T1 energy may be estimated by taking the maximum from the highest energy (e.g. shortest wavelength) peak in a phosphorescence emission spectrum measured at low temperature.

A material may also be a suitable host for a phosphorescent dopant if it has a higher energy lowest occupied molecular orbital (LUMO) than the phosphorescent dopant. This may help to transfer electrons from the higher energy LUMO of the phosphorescent host to the lower energy LUMO of the phosphorescent dopant, thus promoting formation of excitons in the dopant. In some embodiments, the absolute value of the difference (e.g. the value as a positive number regardless whether the difference is positive or negative) between the energy of the LUMO of the phosphorescent host and the energy of the LUMO of the phosphorescent dopant may be about 0.01-1.5 eV, about 0.05-1.0 eV or about 0.1-0.5 eV.

A phosphorescent material may also be a suitable host for a phosphorescent dopant if it has a lower energy highest occupied molecular orbital (HOMO) than the phosphorescent dopant. This may help to transfer holes from the lower energy HOMO of the phosphorescent host to the higher energy HOMO of the phosphorescent dopant, thus promoting formation of excitons in the dopant. In some embodiments, the absolute value of the difference between the energy of the HOMO of the phosphorescent host and the energy of the HOMO of the phosphorescent dopant may be about 0.01-1.5 eV, about 0.05-1.0 eV or about 0.1-0.5 eV.

The phosphorescent host also has a higher electron mobility than hole mobility. In some embodiments, the phosphorescent layer (and not just the phosphorescent host) has a higher electron mobility than hole mobility. For OLED devices comprising a hole-transport layer and an electron-transport layer, the hole-transport layer may transport holes at a substantially faster rate than the electron-transport layer transports electrons. If the hole-transport rate in the phosphorescent layer is sufficiently fast, the holes may be transported through the phosphorescent layer before electrons can travel a significant distance from the electron-transport layer. This may prevent formation of excitons in the fluorescent layer and thus reduce blue emission. Like the fluorescent layer, another advantage of having a higher electron mobility than hole mobility is in the phosphorescent layer is that it may provide better charge balance to the fast moving holes from the hole-transport layer and may improve the stability of a phosphorescent layer. In some embodiments, the electron mobility may be about 1-10,000, about 1-1000, or about 2-100 times that of the hole mobility in a phosphorescent host or a phosphorescent layer. In some embodiments, the electron mobility may be at least about 2, at least about 40, or at least about 80 times that of the hole mobility in a phosphorescent host or a phosphorescent layer.

In some embodiments, the emissive layers or the hosts of the emissive layers (e.g. the fluorescent layers and the phosphorescent layers) may have a gradient of electron mobility. For example, the emissive layers closest to the electron-transport layer or the cathode may have the highest electron mobility, and the emissive layers closest to the hole-transport layer or anode may have the lowest electron mobility. This may help to form excitons toward the center of the emissive construct, which may improve efficiency and color. For example, the second phosphorescent layer, if present, may have a higher electron mobility than the first phosphorescent layer. In some embodiments, the second phosphorescence layer may have an electron mobility that is about 1-10,000, about 1-1000, or about 2-100 times higher than the electron mobility of the first phosphorescence layer. In some embodiments, the second phosphorescence layer may have an electron mobility that is at least about 2, at least about 40, or at least about 80 times higher than the electron mobility of the first phosphorescence layer. Similarly, the first phosphorescent layer may have a higher electron mobility than the fluorescent layer. In some embodiments, the first phosphorescent layer may have an electron mobility that is about 1-10,000, about 1-1000, or about 2-100 times higher than the electron mobility of the fluorescence layer. In some embodiments, the first phosphorescent layer may have an electron mobility that is at least about 2, at least about 40, or at least about 80 times higher than the electron mobility of the fluorescence layer. The layers may also be fabricated by a gradual change of composition within the layer so that the gradient of electron mobility is continuous rather than stepped.

Some non-limiting examples of phosphorescent hosts may include materials described in US 20100213831, by inventors Sisk, et. al. and having a title "Ambipolar Host in Organic Light Emitting Diode) (e.g. pp. 1-6) (U.S. Pat. No. 8,003,229) and US 20120179089, filed on Sep. 14, 2011 by inventors Sisk, et. al. under the title "Substituted Bipyridines for Use in Organic Light-Emitting Devices", both of which are incorporated by reference herein. In some embodiments, the host may be selected from:

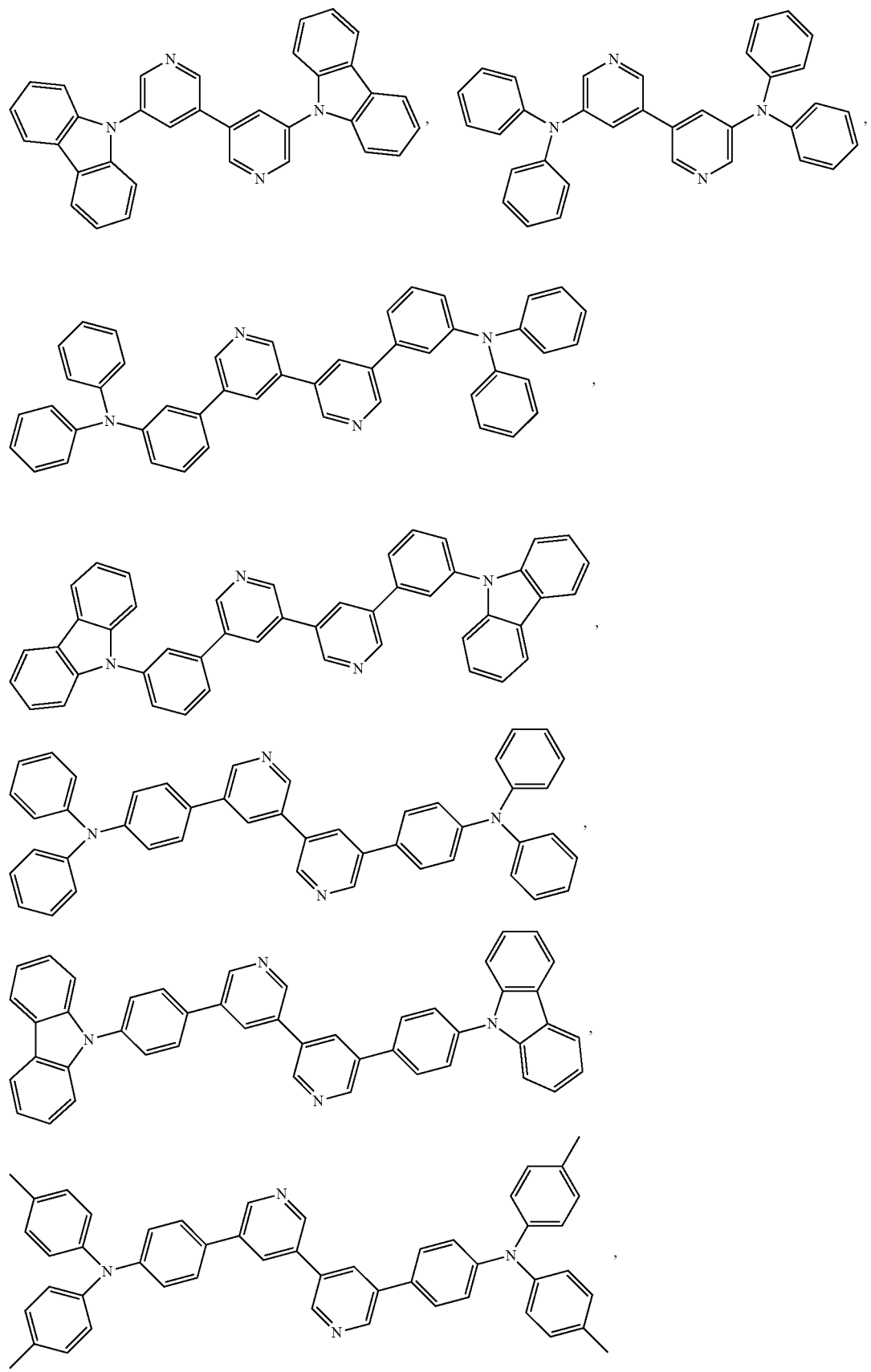

-continued
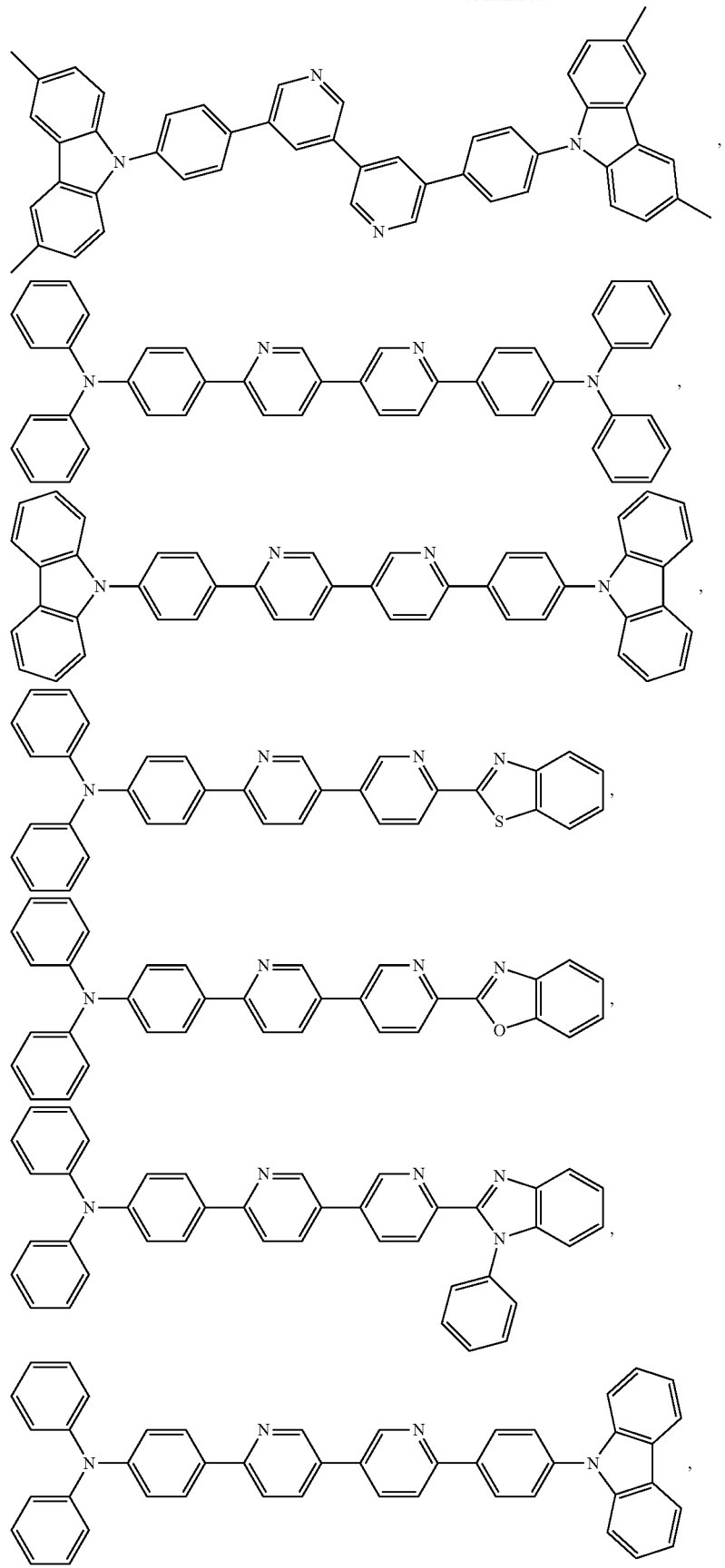

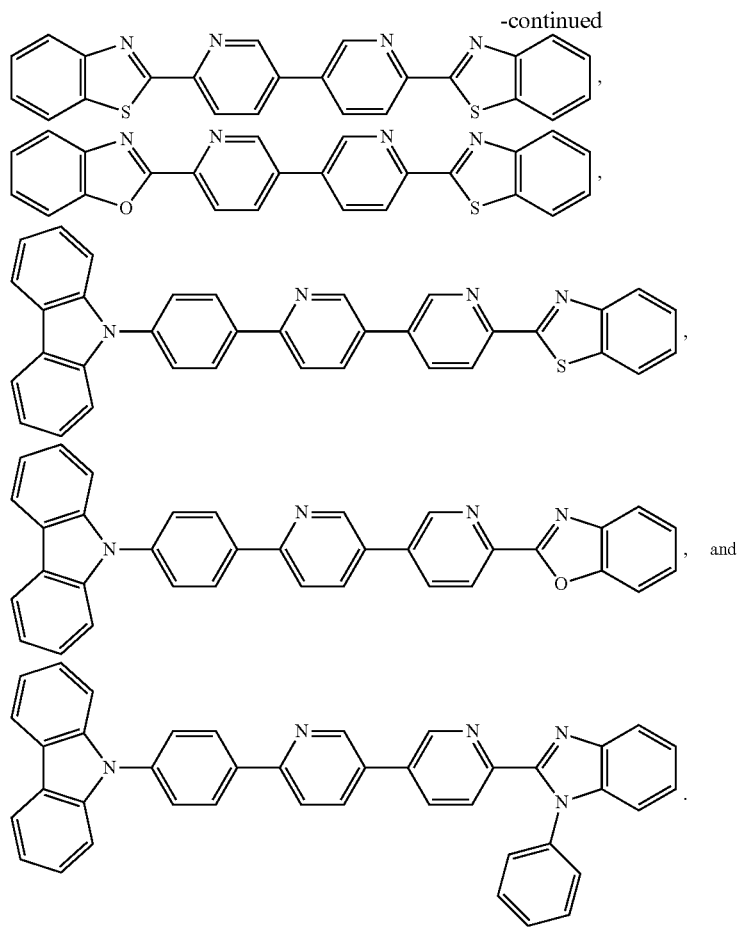

In some embodiments, the phosphorescent host is non-polymeric. In some embodiments, the phosphorescent host has a weight average molecular weight of less than about 10,000 Da, less than about 5,000 Da, less than about 1,500 Da, less than about 1,000 Da, or less than about 800 Da. In some embodiments, the phosphorescent host can be used as a fluorescent dopant.

| Host Compound | HOMO (eV) | LUMO (eV) | S1 (eV) | T1 (eV) | Hole-transport Rate (cm2/Vs) | Electron-transport Rate (cm2/Vs) |
|---|---|---|---|---|---|---|
| | −5.75 | −2.62 | 2.86 | 2.41 | 3.56e−8 | 2.11e−6 |
| | −5.4 | −2.79 | 2.53 | 2.29 | 4.23e−7 | 2.73e−6 |

A phosphorescent dopant may be any compound that phosphoresces in the visible range. Some non-limiting examples of phosphorescent dopants may include materials described in US 20100213831, by inventors Sisk, et. al. and having a title "Ambipolar Host in Organic Light Emitting Diode) (U.S. Pat. No. 8,003,229) and US 20120179089, filed on Sep. 14, 2011 by inventors Sisk, et. al. under the title "Substituted Bipyridines for Use in Organic Light-Emitting Devices". A relatively high quantum yield visibly phosphorescing compound may improve efficiency of the device. In some embodiments, the phosphorescent dopant may have a phosphorescent quantum yield of about 0.1-1.0 or about 0.5-0.9. In some embodiments, the phosphorescent dopant is an Ir complex emitter, such as one of the following:

| Phosphorescent Compound | HOMO (eV) | LUMO (eV) | S1 | T1 (eV) |
|---|---|---|---|---|
| Ir(phq)2acac | −5.26 | −2.62 | | 2.2 |
| YE-01 | −5.2 | −2.38 | | 2.28 |
| Ir(piq)3 | −5.15 | −2.57 | | 2 |
| Ir(piq)2acac | −5.23 | −2.63 | | 2.1? |

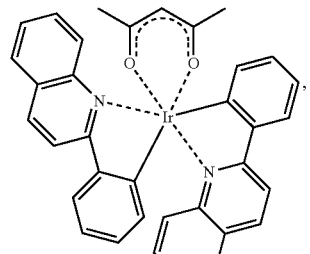

[Ir(phq)2(acac)]

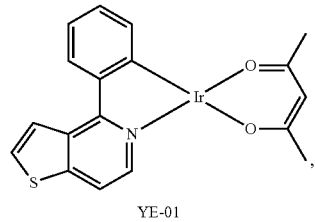

YE-01

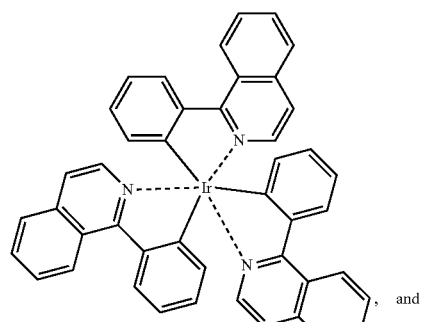

Ir(piq)3

| Phosphorescent Compound | HOMO (eV) | LUMO (eV) | S1 | T1 (eV) |
|---|---|---|---|---|

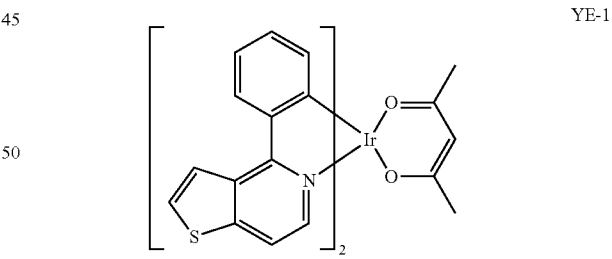

Ir(piq)2acac

In some embodiments, a phosphorescent dopant is non-polymeric.

In some embodiments, a phosphorescent dopant may emit red, orange, yellow, or green light by phosphorescence, or may emit visible photons having an average wavelength in the range of about 500 nm to about 800 nm, about 570 nm to about 780 nm, or in the range between any of the aforementioned average wavelengths, e.g., about 500 nm to about 780 nm. A red-emitting phosphorescent dopant may emit visible photons having an average wavelength in the range of about 600 nm to about 800 nm or about 620 nm to about 780 nm. Some examples of red-emitting phosphorescent dopants may include, but are not limited to Ir(piq)2acac, Ir(MDQ)2acac, Ir(piq)3.

An orange-emitting phosphorescent dopant may emit visible photons having an average wavelength in the range of about 575 nm to about 650 nm or about 585 nm to about 620 nm. Some examples of orange-emitting phosphorescent dopants may include, but are not limited to Ir(pq)2acac.

A yellow-emitting phosphorescent dopant may emit visible photons having an average wavelength in the range of about 560 nm to about 590 nm or about 570 nm to about 585 nm. Some examples of orange-emitting phosphorescent dopants may include, but are not limited to YE-1.

YE-1

A green-emitting phosphorescent dopant may emit visible photons having an average wavelength in the range of about 500 nm to about 570 nm or about 510 nm to about 560 nm. Some examples of orange-emitting phosphorescent dopants may include, but are not limited to Ir(ppy)3.

The "average wavelength" of visible photons may include, when referring to the visible emission spectrum of a compound, the wavelength wherein the area under the curve for the part of the visible spectrum having a lower wavelength than the average wavelength is about equal to the area under the curve for the part of the visible spectrum having a higher wavelength than the average wavelength.

In some embodiments, the first phosphorescent dopant may have a higher energy T1 than the fluorescent dopant, and/or the fluorescent host.

The amount of a phosphorescent dopant in the emissive layer may vary. For example, the amount of phosphorescent dopant may be: about 0.1% to about 10%, about 3 to about 8%, or about 5% by weight.

The thickness of the first phosphorescent layer may vary. In some embodiments, the first phosphorescent layer may have a thickness in the range of 1 nm to about 100 nm, about 10 nm to about 50 nm, or about 20 nm If a second phosphorescent layer is present, it may be disposed on first phosphorescent layer.

In some embodiments, the first phosphorescent dopant and the second phosphorescent dopant emit red, orange, yellow, or green photons. In some embodiments the first phosphorescent dopant is a yellow-emitting phosphorescent dopant and the second phosphorescent dopant is a red-emitting phosphorescent dopant.

The thickness of a second phosphorescent layer may vary. In some embodiments, the second phosphorescent layer may have a thickness in the range of about 0.1 nm to about 20 nm, about 1 nm to about 1 nm, or about 3 nm.

If the emissive construct comprises a first phosphorescent layer and a second phosphorescent layer, the thickness of the two layers together may vary. In some embodiments the thickness of the first phosphorescent layer and the second phosphorescent layer combined may be in the range of 1 nm to about 100 nm, about 10 nm to about 50 nm, or about 23 nm.

An exciton blocking layer is disposed between the fluorescent layer and the phosphorescent layer(s). In some embodiments, the exciton blocking layer is disposed on the fluorescent layer. In some embodiments, the phosphorescent layer is disposed on the exciton blocking layer. The exciton blocking layer may be any material that can prevent triplet diffusion from a higher T1 first phosphorescent layer to a lower T1 fluorescent layer. Since the fluorescent layer may have a low phosphorescent quantum yield as compared to the phosphorescent layers, this may reduce nonradiative T1 relaxation in the fluorescent layer, and may thus improve efficiency. In some embodiments, the T1 of the exciton blocking layer may be higher than T1 of the fluorescent host, the fluorescent dopant, the first phosphorescent host, and/or the first phosphorescent dopant. In some embodiments, the T1 of the exciton blocking layer may be about 0.05-1.5 eV, about 0.1-1.0 eV, or about 0.2-0.6 eV higher than the T1 of all of: the fluorescent host, the fluorescent dopant, the first phosphorescent host, and the first phosphorescent dopant.

In addition to being capable of blocking excitons, the exciton blocking layer may be electron-transporting, hole-transporting or ambipolar. In some embodiments, the exciton blocking layer has a substantially greater electron mobility than hole mobility. For example, the exciton blocking layer may have an electron mobility that is about 1-10,000, about 1-1000, or about 2-100 times higher than the hole mobility. As another example, the exciton blocking layer may have an electron mobility that is at least about 2, at least about 40, or at least about 80 times higher than the hole mobility.

Some non-limiting examples of materials for an exciton blocking layer may include materials such as CBP, TcTa, TPBi, etc., as well as host compounds described in US 20100213831, by inventors Sisk, et. al. and having a title "Ambipolar Host in Organic Light Emitting Diode) (e.g. pp. 1-6) (U.S. Pat. No. 8,003,229), and US 2011/0140093, filed on Feb. 23, 2011 by inventor Shijun Zheng, and having a title "Compounds For use In Light-Emitting Devices", both of which are incorporated by reference in their entirety. Although the materials used for the exciton blocking layer can also be used as host materials, in some embodiments, the exciton blocking layer is a different material than the fluorescent host and the first phosphorescent host.

| Exciton Blocking Material | HOMO | LUMO | S1 | T1 | Hole-transport Rate | Electron-transport Rate |
|---|---|---|---|---|---|---|
| CBP | −5.6 | −2.2 | 3.32 | 2.6 | 1e−4 | 1e−4 |
| TPBi | −5.9 | −2.3 | 3.27 | 2.68 | 2.8e−10 | 2.5e−6 |
| TcTa | −5.5 | −2.2 | 3.21 | 2.87 | 1e−4~1e−3 | 1e−8 |

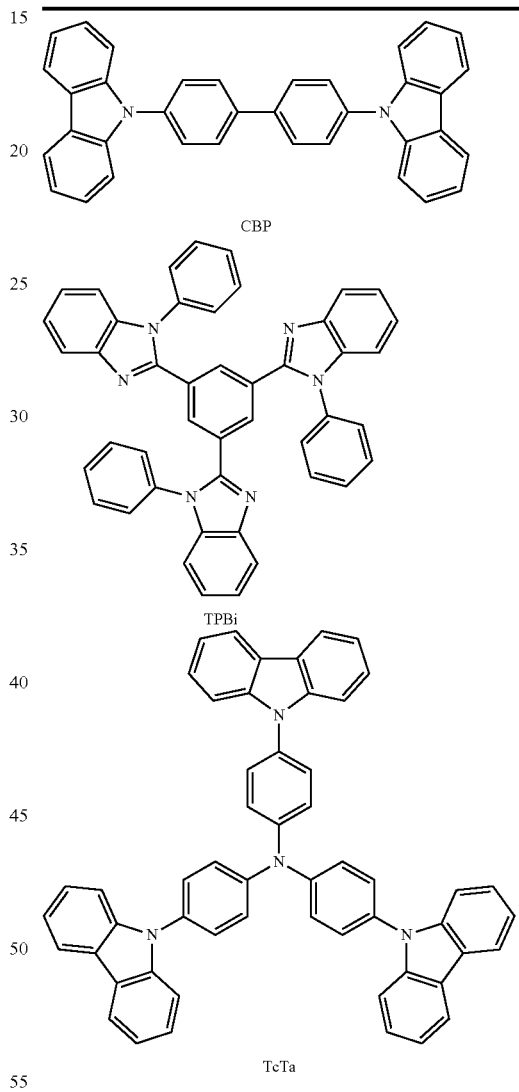

The thickness of the exciton blocking layer may vary. In some embodiments, the thickness may be about 0.5 nm to about 10 nm, about 1 nm to about 5 nm, or about 3 nm.

The emissive constructs described herein may be used in a device such as a light-emitting device. A light-emitting device may include an anode, a cathode, and an emissive construct disposed between the anode and the cathode. Some devices, such as those depicted by FIG. 1, may include additional layers. With regard to FIG. 1, an emissive construct 10 may include a fluorescent layer 20, and an exciton blocking layer 30 may be disposed on the fluorescent layer.

A first phosphorescent layer 40 may be disposed on the exciton blocking layer 30. An optional second phosphorescent layer 50 may also be disposed on the first phosphorescent layer 40. An electron-transport layer 60 may be disposed on the second phosphorescent layer 50 (if present) or the first phosphorescent layer 40. A cathode 70 may be disposed on the electron-transport layer 60. The fluorescent layer 20 may be disposed on a hole-transport layer 80. The hole-transport layer 80 may be disposed on a hole-injecting layer 90. The hole-injecting layer 90 may be disposed on the anode 100.

Figure 2A:
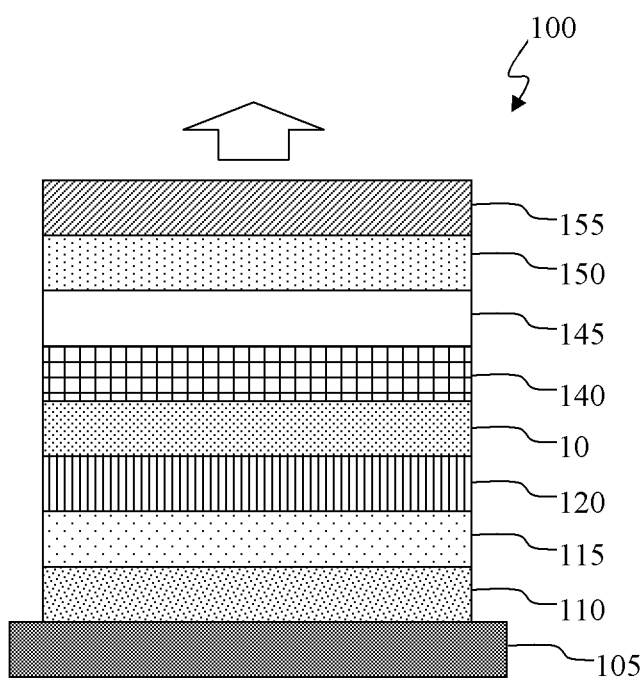
FIG. 2A is a schematic of an embodiment of a light emitting device.

Some devices, such as those depicted by FIG. 2A, include the anode 110 disposed on the substrate 105 so that the two layers 105/110 have some direct contact. Alternatively, other layers may be present between the substrate 105 and the reflective anode 110. For example, an adhesive layer (not illustrated in FIG. 1) comprising a material such as an epoxy may be between the substrate 105 and the anode 110. The hole-transport layer 120 may be disposed on the hole-injection layer 115 so that the two layers have some direct contact. Alternatively, one or more layers comprising one or more materials such as hole-transport material, hole-injection material, etc., may be present between the two layers 115/120.

The emissive construct 10, as described above, may be disposed on the hole-transport layer 120 so that the two layers have some direct contact. Alternatively, one or more layers comprising one or more materials such as hole-transport material, exciton-blocking material, electron blocking-material, etc., may be present between the two layers 120/10.

The electron-transport layer 140 may be disposed on the emissive component 10 so that the two layers have some direct contact. In some embodiments, one or more layers comprising one or more materials such as electron-transport material, exciton-blocking material, hole-blocking material, etc., may be present between the two layers.

The cathode 145 may be disposed on the electron-transport layer 140 so that the two layers 140/145 have some direct contact. Alternatively, one or more layers comprising one or more materials such as electron-transport material, electron-injection material, etc., may be present between the two layers 140/145.

The light-scattering layer 155 may be disposed on the enhancement layer 150 so that the two layers 150/155 have some direct contact. Alternatively, one or more layers comprising a transparent material or a filling material may be present between the two layers 150/155. For example, a filling material may comprise a transparent polymer such as an epoxy or a transparent inorganic material.

The substrate 105 may comprise any suitable material, including (rigid or flexible) glass, metal sheet, organic polymer plastic, inorganic materials, ceramics, etc., or combinations thereof. A substrate may be transparent or opaque. For example the substrate may not allow light to pass through it, or may alternatively have a percent transmittance of about 10%, about 50%, about 80%, about 90%, about 99%, or any percent transmittance in a range bounded by, or between, any of these values. In some embodiments, the substrate may have a transmittance in the range of about 10% to about 99%, about 50% to about 99%, or about 10% to about 50%.

The anode may be a layer comprising a conventional material such as a metal, mixed metal, alloy, metal oxide or mixed-metal oxide, conductive polymer, and/or an inorganic material such as carbon nanotube (CNT). Examples of suitable metals include the Group 1 metals, the metals in Groups 4, 5, 6, and the Group 8-10 transition metals. If the anode layer is to be light-transmitting, metals in Group 10 and 11, such as Au, Pt, and Ag, or alloys thereof; or mixed-metal oxides of Group 12, 13, and 14 metals, such as indium-tin-oxide (ITO), indium-zinc-oxide (IZO), and the like, may be used. In some embodiments, the anode layer may be an organic material such as polyaniline. The use of polyaniline is described in "Flexible light-emitting diodes made from soluble conducting polymer," Nature, vol. 357, pp. 477-479 (11 Jun. 1992). In some embodiments, the anode layer can have a thickness in the range of about 1 nm to about 1000 nm, about 50 nm to 500 nm, or about 50 nm to about 300 nm.

Figure 2B:
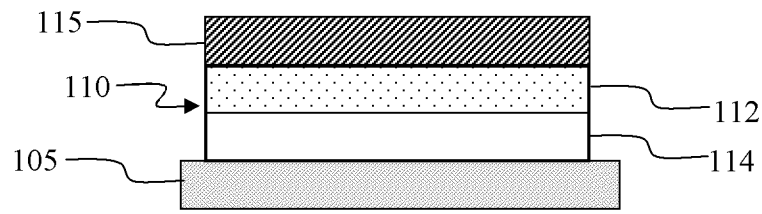
FIG. 2B is a schematic of an embodiment of a light emitting device.

In some embodiments, an anode, e.g., the anode layer, may be a reflective anode, which may include any anode that reflects at least a portion of light that encounters the surface of the anode. In some embodiments, the anode reflects at least about 80%, at least about 90%, at least about 95%, or at least about 99% of light that encounters the surface of the anode, and the amount of light reflected may approach 100% of light that encounters the surface. In some embodiments, the anode 110 may be a combination of sublayers. For example, as shown in FIG. 2B, the anode 110 may comprise a first anode sublayer 114 and a second anode sublayer 112. The second anode sublayer 112 may be disposed on the first anode sublayer 114 so that the two sublayers have some direct contact. Another layer of the device, such as a hole-injection layer 115 may be in contact with the second anode sublayer 112.

The first anode sublayer 114 may comprise Al, Ag, Ni, or a combination thereof. The thickness of a first anode sublayer may vary. For example, a first anode sublayer may have thickness of about 10 nm, about 50 nm, about 70 nm, about 100 nm, or any thickness in a range defined by, or between, any of these values. In some embodiments, a first anode sublayer may have a thickness in a range of about 10 nm to about 100 nm, about 10 nm to about 70 nm, or about 50 nm to about 100 nm.

The second anode sublayer 112 may comprise Al, Ag, Au, or a combination thereof. The thickness of a second anode sublayer may also vary. For example, a second anode sublayer may have a thickness of about 25 nm, about 50 nm, to about 200 nm, or any thickness in a range defined by, or between, any of these values. In some embodiments, a second anode sublayer may have a thickness in a range of about 5 nm to about 200 nm, about 10 nm to about 100 nm, or about 30 nm to about 70 nm.

In some embodiments, the first anode sublayer may comprise Ag and/or the second anode sublayer may comprise Al.

A cathode may be a layer including a material having a lower work function than the anode layer. Examples of suitable materials for the cathode layer include those selected from alkali metals of Group 1, Group 2 metals, Group 12 metals including rare earth elements, lanthanides and actinides, materials such as aluminum, indium, calcium, barium, samarium and magnesium, and combinations thereof. Li-containing organometallic compounds, LiF, and $Li_2O$ may also be deposited between the organic layer and the cathode layer to lower the operating voltage. Suitable low work function metals include, but are not limited to: Al, Ag, Mg, Ca, Cu, Mg/Ag, LiF/Al, CsF, CsF/Al or alloys thereof, indium tin oxide (ITO), Al:ZnO, or transparent and conducting carbon materials such as carbon nano-tubes (CNT) or graphene. In some embodiments, the cathode layer can have a thickness in the range of about 1 nm to about 1000 nm. In some embodiments, a cathode layer comprising a metal may have a thickness of: at least about 1 nm, about 5 nm, or about 10 nm; and/or up to about 30 nm, about 50 nm, or about 100 nm. In some embodiments, a cathode layer comprising a transparent material such as a metal oxide may have a thickness of: at least about 50 nm, about 100 nm, about 200 nm, and/or up to about 500 nm, about 800 nm, or about 1000 nm.

Figure 2C:
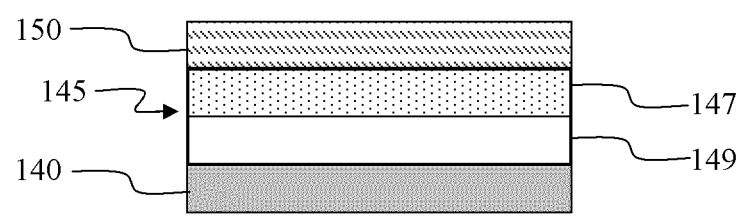
FIG. 2C is a schematic of an embodiment of a light emitting device.

The cathode may be transparent or semi-transparent. A transparent cathode may include a cathode through which most light passes. A semi-transparent cathode may include a cathode that is not transparent, but through which some light may pass. In some embodiments, a cathode may have a relative transmittance of: at least about 50%, at least about 60%, at least about 80%, or at least about 90%, and may approach 100%. In some embodiments, the cathode 145 may be a combination of sublayers. For example, as shown in FIG. 2C, such a cathode may comprise a first cathode sublayer 149 and a second cathode sublayer 147. In some embodiments, the first cathode sublayer 149 may be disposed on an electron transport layer 140. In some embodiments, an enhancement layer 150 may be disposed on the second cathode sublayer 147.

The first cathode sublayer may comprise alkali metals of Group 1, Group 2 metals, Group 12 metals including rare earth elements, lanthanides and actinides, materials such as aluminum, indium, calcium, barium, samarium and magnesium, and combinations thereof. In some embodiments, the first cathode sublayer comprises Mg, Ca, Mg/Ag, LiF/Al, CsF, CsF/Al or alloys thereof.

The thickness of a first cathode sublayer may vary. For example, a first cathode sublayer may have thickness of about 0.1 nm, about 1 nm, about 2 nm, about 4 nm, about 5 nm, about 6 nm, about 10 nm, about 12 nm, about 20 nm, about 50 nm, or any thickness in a range defined by, or between, any of these values. In some embodiments, the first cathode sublayer may have a thickness in a range of about 0.1 nm to about 50 nm, about 1 nm to about 20 nm, about 2 nm to about 10 nm, or about 4 nm.

The second cathode sublayer may comprise alkali metals of Group 1, Group 2 metals, Group 12 metals including rare earth elements, lanthanides and actinides, materials such as aluminum, indium, calcium, barium, samarium and magnesium, and combinations thereof. In some embodiments, the second cathode sublayer comprises Al, Ag, Au, Cu, Mg/Ag, or alloys thereof.

The thickness of a second cathode sublayer may also vary. For example, a second cathode sublayer may have a thickness of about 0.1 nm, about 1 nm, about 2 nm, about 4 nm, about 5 nm, about 6 nm, about 10 nm, about 12 nm, about 20 nm, about 50 nm, or any thickness in a range defined by, or between, any of these values. In some embodiments, a second cathode sublayer may have a thickness in a range of about 0.1 nm to about 50 nm, about 1 nm to about 20 nm, about 5 nm to about 20 nm, or about 12 nm.

In some embodiments, the first cathode sublayer comprises Ca and/or the second cathode sublayer comprises Au. In some embodiments, the first cathode sublayer is about 4 nm thick and/or the second cathode sublayer is about 12 nm thick.

A hole-transport layer may be disposed between the anode and a light-emitting layer, or between a hole-injecting layer and a light-emitting layer such as a fluorescent layer. The hole-transport layer may comprise at least one hole-transport material. Hole-transport materials may include, but are not limited to, an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; an oxadiazole; copper phthalocyanine; 1,1-Bis(4-bis(4-methylphenyl)aminophenyl)cyclohexane; 2,9-Dimethyl-4,7-diphenyl-1,10-phenanthroline; 3,5-Bis(4-tert-butyl-phenyl)-4-phenyl[1,2,4]triazole; 3,4,5-Triphenyl-1,2,3-triazole; 4,4',4''-tris(3-methylphenylphenylamino)triphenylamine (MTDATA); N,N'-bis(3-methylphenyl)N,N'-diphenyl-[1,1'-biphenyl]-4,4'-diamine (TPD); 4,4'-bis[N-(naphthyl)-N-phenyl-amino]biphenyl (α-NPD); 4,4',4''-tris(carbazol-9-yl)-triphenylamine (TCTA); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); Bis [4-(p,p'-ditolyl-amino)phenyl]diphenylsilane (DTASi); 2,2'-bis(4-carbazolylphenyl)-1,1'-biphenyl (4CzPBP); N,N'N''-1,3,5-tricarbazoloylbenzene (tCP); N,N'-bis(4-butylphenyl)-N,N'-bis(phenyl)benzidine; or the like.

A hole-injecting layer may be disposed between a light-emitting layer and the anode, or between a hole-transport layer and the anode. Examples of suitable hole-injecting material(s) include, but are not limited to, an optionally substituted compound selected from the following: a polythiophene derivative such as poly(3,4-ethylenedioxythiophene (PEDOT)/polystyrene sulphonic acid (PSS), a benzidine derivative such as N,N,N',N'-tetraphenylbenzidine, poly(N,N'-bis(4-butylphenyl)-N,N'-bis(phenyl)benzidine), a triphenyl amine or phenylenediamine derivative such as N,N'-bis(4-methylphenyl)-N,N'-bis(phenyl)-1,4-phenylene-diamine, 4,4',4''-tris(N-(naphthylen-2-yl)-N-phenylamino) triphenylamine, an oxadiazole derivative such as 1,3-bis(5-(4-diphenylamino)phenyl-1,3,4-oxadiazol-2-yl)benzene, a polyacetylene derivative such as poly(1,2-bis-benzylthioacetylene), and a phthalocyanine metal complex derivative such as phthalocyanine copper, a hydracarbon polymer.

An electron-transport layer may be disposed between the cathode and a light-emitting layer such as the first phosphorescent layer or the second phosphorescent layer (if present). Examples of electron-transport materials may include, but are not limited to, 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4-triazole (TAZ), 2,9-dimethyl-4,7-diphenyl-phenanthroline (bathocuproine or BCP); and 1,3,5-tris[2-N-phenylbenzimidazol-z-yl]benzene (TPBI). In one embodiment, the electron transport layer is aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a combination thereof.

If desired, additional layers may be included in the light-emitting device, such an electron injecting layer (EIL), a hole-blocking layer (HBL), etc.

In some embodiments, the light-emitting device can include an electron-injecting layer between the cathode layer and the light-emitting layer. Examples of suitable material(s) that can be included in the electron injecting layer include but are not limited to, an optionally substituted compound selected from the following: aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenyl-benzimidazol-z-yl]benzene (TPBI) a triazine, a metal chelate of 8-hydroxyquinoline such as tris(8-hydroxyquinoliate) aluminum, and a metal thioxinoid compound such as bis(8-quinolinethiolato) zinc. In one embodiment, the electron injecting layer is aluminum quinolate (Alq$_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl]benzene (TPBI), or a derivative or a combination thereof.

In some embodiments, the device can include a hole-blocking layer, e.g., between the cathode and the light-emitting layer. Various suitable hole-blocking materials that can be included in the hole-blocking layer are known to those skilled in the art. Suitable hole-blocking material(s) include but are not limited to, an optionally substituted compound selected from the following: bathocuproine (BCP), 3,4,5-triphenyl-1,2,4-triazole, 3,5-bis(4-tert-butylphenyl)-4-phenyl-[1,2,4]triazole, 2,9-dimethyl-4,7-diphenyl-1,10-phenanthroline, and 1,1-bis(4-bis(4-methylphenyl)aminophenyl)-cyclohexane.

EXAMPLE 1

Measuring Charge Mobility

The carrier mobility of an organic thin film can be derived from the space charge limited current in the current-voltage (IV) measurement based on the Mott's steady state SCLC model $$J = \frac{9\varepsilon\varepsilon_0 \mu V^2}{8L^3}$$

where $\epsilon_0$ is the vacuum permittivity, $\epsilon$ is the relative permittivity of the organic layer, $\mu$ is the carrier mobility of the organic layer, V is the voltage bias and L is the thickness of the organic layer.

To evaluate the electron and hole mobility of an organic layer, single-carrier devices (electron-only and hole-only devices) may be made. Electron-only devices may have Al/organic layer/LiF/Al structure with Al as the anode and LiF/Al as the cathode. The LiF/Al electrode has a low work function (~2.6 eV) which can facilitate the injection of electrons into the lower lying LUMO of the organic layer. By contrast, Al has a relatively lower work function (4.28 eV) than the HOMO (5~6 eV) of the organic layer being investigated, which prevents the hole injection from the anode. Thus, only electrons are injected into the organic layer and the electron mobility may be measured as the only charge carrier in the organic layer.

The hole-only devices may have the ITO/PEDOT/organic layer/Al with ITO as the anode and Al as the cathode. The high work function of PEDOT (5.2-5.4 eV) facilitates hole injection from the anode into the organic layer. By contrast, the work function (4.28 eV) of Al is higher than the LUMO of the organic layer (2~4 eV), which preventing the electron injection from the cathode. Thus, only holes are injected into the organic layer, and the hole mobility may be measured as the only charge carrier in the organic layer.

The thickness of the organic layer is kept at 100 nm in both cases.

To measure the space charge limited current, one applies a large voltage scan (0-10 V) on the device to ensure at large current limit the device is under SCLC condition. And then the IV curve is fitted by the SCLC model mentioned above. The carrier mobility can then be derived from the fitting parameters. Electron- and hole-mobility can be derived from the electron-only and hole-only devices for the same organic layer, respectively.

EXAMPLE 2

Fabrication of light-emitting device: the ITO coated glass substrates were cleaned by ultrasound in acetone, and consecutively in 2-propanol, baked at 110° C. for 3 hours, followed by treatment with oxygen plasma for 30 min. A layer of PEDOT: PSS (HIL 1.1 purchased from H.C. Starck) was spin-coated at 4000 rpm onto the pre-cleaned and O$_2$-plasma treated (ITO)-substrate and annealed at 180° C. for 10 min, yielding a thickness of around 40 nm. In a glove-box hosted vacuum deposition system at a pressure of 10$^{-7}$ torr (1 torr=133.322 Pa), NPB was first deposited on top of PEDOT/PSS layer at deposition rate of 0.1 nm/s, yielding a 40 nm thick film. A 5 nm-thick layer of ADN doped with blue fluorescent emitter DPAVBi with 3 wt % was deposited on top of NPB, followed by a 3 nm-thick CBP exciton blocking layer. Then a 20 nm-thick layer containing Host Compound A (structure shown below) doped with YE-01 at 5 wt % concentration was deposited. Subsequently a 3 nm-thick layer containing Host Compound A doped with Ir(piq)2acac at 5 wt % concentration is deposited. Then a 30 nm thick layer of 1,3,5-tris(N-phenylbenzimidizol-2-yl)benzene (TPBI) at deposition rate around 0.1 nm/s. LiF (1 nm) and Al were then deposited successively at deposition rates of 0.015 and 0.3 nm/s, respectively. Each individual device has areas of 0.12 cm$^2$. The spectra and brightness are measured by PhotoResearch spectrum meter PR 670. All device operation is carried out inside a nitrogen-filled glove-box.

Host Compound A

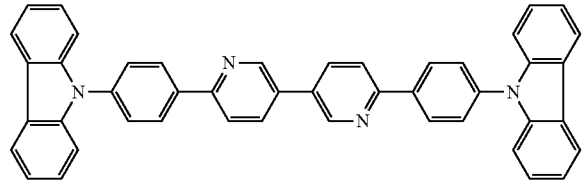 [SMILES: c1ccc2c(c1)c1ccccc1n2-c1ccc(-c2ccc(-c3ccc(-c4ccc(-n5c6ccccc6c6ccccc65)cc4)nc3)cn2)cc1]

EXAMPLE-3

Performance of OLED Device in Example 2

The current-voltage-brightness (I-V-L) characteristics and EL spectra of the devices were measured by a Keithley 2612 A sourcemeter (Keithley Instruments, Inc., Cleveland, Ohio, USA) and a PhotoResearch PR-670 spectroradiometer (Photo Research, Inc., Chatsworth, Calif., USA) controlled by a homemade software. The device made in Example-1 has achieved 25 lm/W, 43.8 cd/A @1000 cd/m2, CIE (0.46, 0.45)

Figure 3:
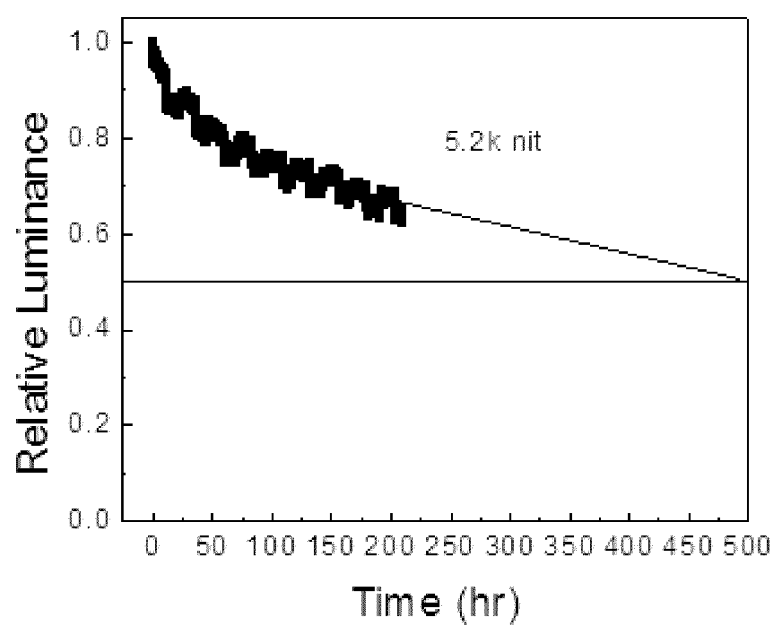
FIG. 3 is a plot of relative luminance over time for the OLED device in Example 2A.

The lifetime of the devices at various initial brightnesses were measured under various constant current. T50, the period of time before the device brightness drops to half of the initial brightness, has been measured. There exists an empirical relation between brightness and T50, (L*T50)$^n$=C, where L represents the initial brightness, n is an acceleration factor and C is a constant. For the device in Example-1, T50 at an initial brightness 5200 cd/cm$^2$ was measured about 500 hours (FIG. 3), T50 at an initial brightness 10,000 cd/cm$^2$ was measured as 103 hours, so T50 for an initial brightness 1000 cd/cm$^2$ is (estimated) ~9700 hours using an acceleration factor n=1.8.

EXAMPLE 4

Figure 2D:
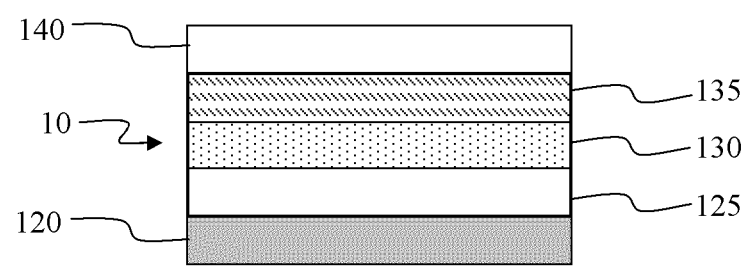
FIG. 2D is a schematic of an embodiment of a light emitting device.

Device B will be prepared having a structure consistent with that depicted in FIGS. 2A and 2D. The layers of the device, from bottom to top will be: a substrate 105 [Glass (0.7 mm)/ITO(55 nm)/PEDOT(30 nm); a reflective-opaque anode 110 (Ag, 50 nm; then Al, 50 nm); a hole-injection layer 115 ($MoO_3$, 10 nm); a hole-transport layer 120 (NPB:MoO3 [5%], 20 nm; NPB, 10 nm); a blue emissive layer 125 (Host-1, 15 nm); an orange phosphorescent layer 130 (Host-1:YE-01 [5%]:Ir(piq)2acac [0.5%], 5 nm); a blue emissive layer 135 (Host-1, 15 nm); an electron-transport layer 140 (TPBI, 30 nm); a semi-transparent cathode 145 (bottom layer of Ca, 4 nm; top layer of Au, 12 nm); an enhancement layer 150 ($SnO_2$, 60 nm); and a light-scattering layer 155 (Compound-2, 4000 nm).

It is anticipated that a device constructed as described in Example 4 will exhibit the same benefits as described with respect to Device A.

Although the claims have been described in the context of certain preferred embodiments and examples, it will be understood by those skilled in the art that the scope of the claims extend beyond the specifically disclosed embodiments to other alternative embodiments and/or uses and obvious modifications and equivalents thereof.

What is claimed is:

1. An emissive construct comprising:
   a fluorescent layer comprising a fluorescent host and a fluorescent dopant, wherein the fluorescent layer has a higher electron mobility than hole mobility;
   a first phosphorescent layer, comprising a first phosphorescent host and a first phosphorescent dopant, wherein the phosphorescent layer has a higher electron mobility than hole mobility, and the first phosphorescent host is:

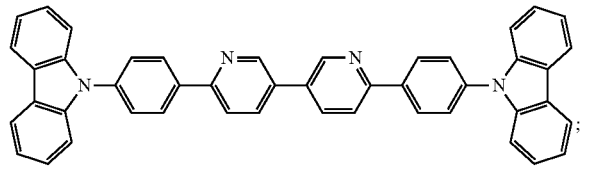 [SMILES: c1ccc2c(c1)c1ccccc1n2-c1ccc(-c2ccc(-c3ccc(-c4ccc(-n5c6ccccc6c6ccccc65)cc4)nc3)cn2)cc1]

and
   an exciton blocking layer disposed between the fluorescent layer and the phosphorescent layer.

2. The emissive construct of claim 1, wherein the exciton layer is disposed on the fluorescent layer and the phosphorescent layer is disposed on the exciton blocking layer.

3. The emissive construct of claim 1, wherein the exciton blocking layer is disposed on the phosphorescent layer and the fluorescent layer is disposed on the exciton blocking layer.

4. The emissive construct of claim 1, wherein:
   the fluorescent layer is disposed on a hole-transport layer;
   an optional second phosphorescent layer is disposed on the first phosphorescent layer; and
   an electron-transport layer is disposed on the first phosphorescent layer, or if the second phosphorescent layer is present, the electron-transport layer is disposed on the second phosphorescent layer.

5. The emissive construct of claim 1, wherein the first phosphorescent dopant has a higher triplet energy than the fluorescent host or the fluorescent dopant.

6. The emissive construct of claim 1, wherein a triplet energy of the phosphorescent host is greater than a triplet energy of the first phosphorescent dopant.

7. The emissive construct of claim 1, wherein the triplet energy of the exciton blocking layer is greater than a triplet energy of the fluorescent host and a triplet energy of the phosphorescent host.

8. The emissive construct of claim 1, wherein the exciton blocking layer is electron-transporting, hole-transporting or ambipolar.

9. The emissive construct of claim 1, wherein the first phosphorescent dopant emits visible photons having an average wavelength in the range of about 500 nm to about 780 nm.

10. The emissive construct of claim 1, further comprising a second phosphorescent layer disposed on the first phosphorescent layer.

11. The emissive construct of claim 10, wherein the triplet energy of the second host is at least about 0.1 eV greater than a triplet energy of the second phosphorescent dopant.

12. The emissive construct of claim 10, wherein the second phosphorescent dopant emits visible photons having an average wavelength in the range of about 570 nm to about 780 nm.

13. The construct of claim 1, wherein:
    the fluorescent host is

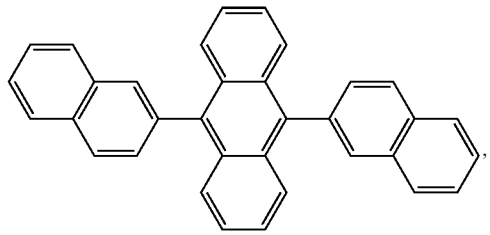 [SMILES: c1ccc2cc(-c3c4ccccc4c(-c4ccc5ccccc5c4)c4ccccc34)ccc2c1]

and
    the blue fluorescent dopant is:

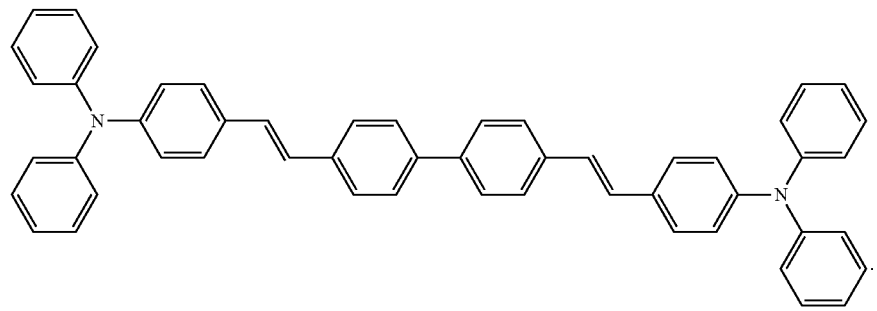 [SMILES: C(=C\c1ccc(N(c2ccccc2)c2ccccc2)cc1)/c1ccc(-c2ccc(/C=C/c3ccc(N(c4ccccc4)c4ccccc4)cc3)cc2)cc1]

14. A light emitting device comprising the emissive construct of claim 1.

15. The construct of claim 1, wherein the first phosphorescent dopant is an Ir complex emitter.

16. The construct of claim 1, wherein the first phosphorescent dopant is selected from the group consisting of:

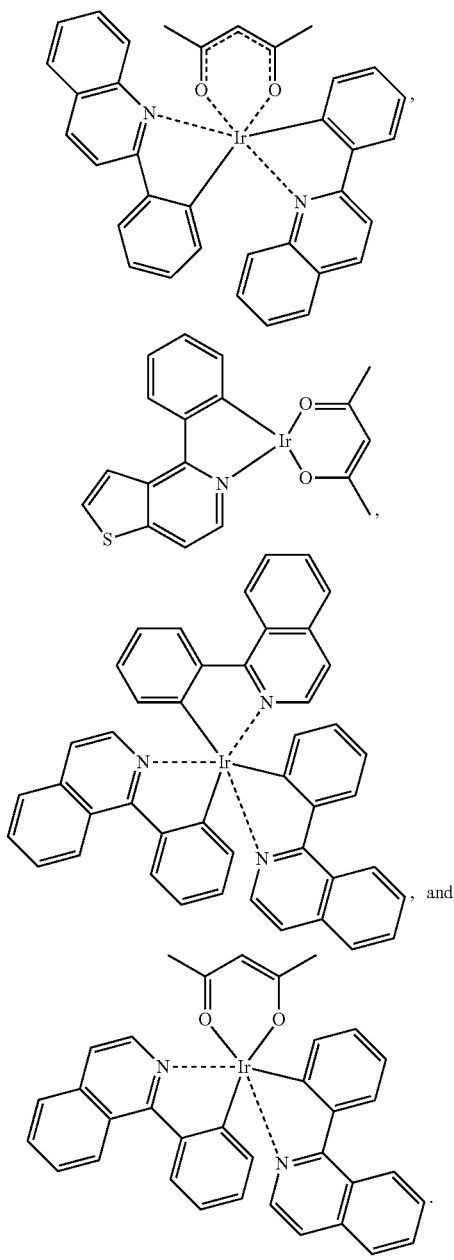

17. The construct of claim 1, wherein the exciton blocking layer comprises at least one of the compound selected from the group consisting of:

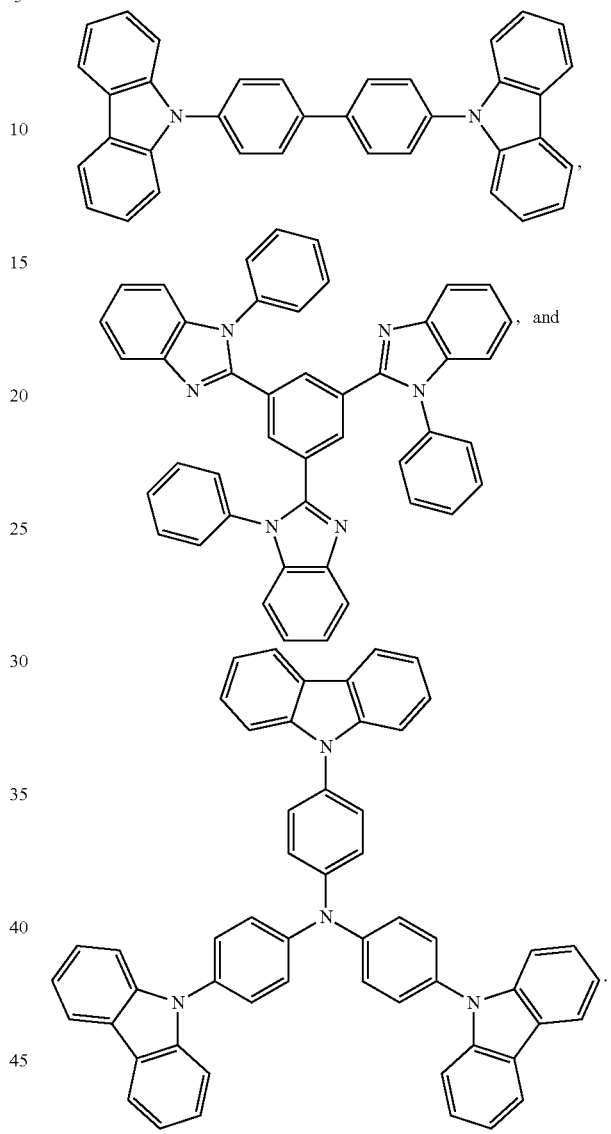

18. The light emitting device of claim 14, further comprising:
an anode layer;
a hole injection layer;
an electron transport layer; and
a cathode layer.

* * * * *